United States Patent [19]
Pelc

[11] Patent Number: 5,318,026
[45] Date of Patent: Jun. 7, 1994

[54] METHOD AND APPARATUS FOR TRACKING OF DEFORMABLE REGIONS BY PHASE CONTRAST MRI

[75] Inventor: Norbert J. Pelc, Los Altos, Calif.

[73] Assignee: Board of Trustees of the LeLand Stanford Junior University, Stanford, Calif.

[21] Appl. No.: 105,815

[22] Filed: Aug. 11, 1993

[51] Int. Cl.$^5$ .............................................. A61B 5/055
[52] U.S. Cl. .................................. 128/653.2; 324/309
[58] Field of Search ........................ 128/653.2, 653.3; 324/309, 307

[56] References Cited

U.S. PATENT DOCUMENTS 5,195,525  3/1993  Pelc ................................... 128/653.2
5,257,625  11/1993  Pelc .................................. 128/653.2
5,257,626  11/1993  Pelc et al. ........................ 128/653.2

*Primary Examiner*—Ruth S. Smith
*Attorney, Agent, or Firm*—Townsend and Townsend Khourie and Crew

[57] ABSTRACT

Motion of a deformable region within an object is tracked using phase contrast magnetic resonance imaging measurements by defining the region with a plurality of vertices, obtaining magnetic resonance signals representative of at least one velocity component from each of the vertices at a plurality of time frames, and tracking motion of the region based on movement of the plurality of vertices. The region can be two-dimensional such as a polygon and ellipse or three-dimensional such as a polyhedron. The deformation can be homogeneous or non-homogeneous in which case the velocity component is defined as a polynomial of at least second order.

12 Claims, 3 Drawing Sheets

METHOD AND APPARATUS FOR TRACKING OF DEFORMABLE REGIONS BY PHASE CONTRAST MRI

BACKGROUND OF THE INVENTION

This invention relates generally to nuclear magnetic resonance imaging (MRI), and more particularly the invention relates to motion analysis and imaging of an organ such as the heart or a system such as the musculo-skeletal system using phase contrast MRI maps of tissue velocity in the organ.

MRI methods that produce images whose intensity is proportional to velocity generally belong to the class called phase contrast MRI. Phase contrast principles have been combined with the cine imaging methods to enable the production of images that portray the distribution of velocities at multiple points in the cardiac cycle. See, Pelc et al., *Magnetic Resonance Quarterly*, Vol. 7, No. 4, 1991, pp. 229-254.

Pelc, U.S. Pat. No. 5,195,525, discloses apparatus and a method for analyzing the motion of specific regions using phase contrast cine data. Basically, the phase contrast MRI technique provides maps of vector velocity in the object through the motion cycle. In the technique described in the '525 patent, the operator selects a region to be tracked by identifying its location in the first frame of the cine image set. The velocity in the region in the first frame is used to calculate its expected location in the second frame. The vector velocity in the second frame at the new location as portrayed in the cine set is used to calculate the position in the third frame, and so on. This tracking can be performed in three dimensions and promises to yield important information about cardiac motion noninvasively. Higher order integration methods can be used to improve the motion estimate.

The '525 patent explains how the motion of a small region can be calculated by integrating the measured velocity data. Copending Pelc application Ser. No. 07/865,437, filed Apr. 9, 1992, now U.S. Pat. No. 5,257,625 explains that if the motion is known to be periodic, this a priori information can be used to advantage. Specifically, the region must return to its starting location at the end of the cycle. This knowledge can be used to improve the stability of the computed motion by iteratively finding the velocity offset that, when subtracted from all the measured velocities, minimizes the discrepancy between the starting and ending positions of the region (i.e., a forced closure). Copending Pelc et al. application Ser. No. 07/921,804, filed Jul. 28, 1992, now U.S. Pat. No. 5,257,626 exploits the that knowledge the motion is periodic in a different manner. Because of the cyclical nature of the motion, integration of the velocity field can be performed not only forward in time but also backward in time. In the backward integration, one computes, for each frame, the location from which the object has come. In this way, two trajectories (forward and backward) are computed. The '804 application shows that there is a preferred manner in which the two can be combined to produce a single estimated trajectory which has lower noise and decreased sensitivity to added velocity errors. Thus, the preferred algorithm for tracking the motion of a region uses forward and backward integration, computation of a combined trajectory, and iterative forced closure.

The '525 patent includes the concept of tracking a deformable region. In this approach, the region is allowed to translate, rotate and deform as it moves through the cycle. Allowing the region to deform is important since much of the information about the functioning of a muscle is obtained in this portion of the analysis, the strain tensor. As explained in the patent, whereas rigid translation is determined by the average velocity in the region at each point in time in the cycle, the information about rotation and deformation (strain) is contained in the spatial derivatives of the velocity field. To calculate rigid motion, one integrates the velocity field. To calculate rotation and strain as functions of time, one integrates the spatial gradients of the velocity field. The concepts of forced closure and bidirectional integration can be used within an algorithm that integrates rotation and deformation.

As is further explained in the '525 patent, one must maintain a consistent coordinate system if the strain information is to integrated properly. Thus, suppose that early in the cycle a region shortens in one direction. This direction, for example, may have something to do with the direction of muscle fibers within the region. Further, suppose that the region also rotates early in the cycle, and later in the cycle, continues to shorten in the direction of the fibers. The direction of shortening has rotated in the laboratory frame but not with respect to the fibers, the relevant frame of reference. Thus, the integration must be performed with respect to a consistent frame of reference. In the '525 patent, this is done by rotating the incremental strain tensor in each frame by the negative of the rotation up to that frame. Integration of the strain tensor is done on the rotated incremental strains.

The present invention is directed to a method and apparatus for tracking of deformable regions by phase contrast MRI which is simpler to implement than the prior art.

SUMMARY OF THE INVENTION

In accordance with the invention, a region of interest is defined by a set of vertices. The region can be two-dimensional (a polygon or ellipse) or three-dimensional (a polyhedron). In each frame, the average velocity and velocity gradients within the region of interest are computed using a least square fit, for example. It is known that this information is all that is needed to describe the motion of the region if the deformation is homogeneous. In addition, the results of the fit are used to estimate the velocities at the vertices. These velocities are then used to track the vertices as in the algorithm that tracks rigid motion with no rotation or deformation. However, if the region has non-zero velocity gradients, the velocities at the vertices will not be the same and the region, as defined by the vertices, will rotate and/or deform. Thus, integration of rotation and strain is done automatically by tracking the vertices separately.

The advantage of using the fit process, and the results of the fit evaluated at the vertices rather than the measured velocity at the vertices is reduced noise. All of the pixels within the region contribute to the estimate of the mean velocity and velocity gradients. As long as the deformation is homogeneous, there is no loss of generality in using this approach. However, the invention can be extended to non-homogeneous deformation.

The invention and objects and features thereof will be more readily understood from the following detailed description and appended claims when taken with the drawing.

DETAILED DESCRIPTION OF ILLUSTRATIVE EMBODIMENT

The invention can be carried out using known MRI apparatus such as disclosed in Pelc, U.S. Pat. No. 5,195,525, supra. As described therein, in tracking cyclical motion, for example myocardial motion, phase contrast cine images of single direction motion (e.g., x) yield pixel by pixel maps of velocity in this direction at regular intervals throughout the cardiac cycle. These data enable recursive derivation of the spatial trajectory of myocardial samples as small as one pixel. A small region of interest (ROI) selected on frame 1 yields the location of the sample in that frame. This, added to the product of the sample's velocity derived from the pixel values in the velocity image in that frame and the time between frames, $\Delta t$, yields an estimate of the expected location of the sample at the second frame. This process can be repeated to generate the path of the sample recursively throughout the entire cycle.

The recursive myocardial motion tracking is generalized to 3 dimensions by treating the images of the three velocity components at a single time, t, in the cardiac cycle as providing a map of the velocity vector $\bar{v} = (V_x, V_y, V_z)$ at each pixel (x, y, z) at that point in time, $\bar{v}(x, y, z, t)$. Letting $\bar{r} = (x, y, z)$, this can also be written $\bar{v}(\bar{r}, t)$. From the location of the sample in the i-th frame, $\bar{r}_i = (x_i, y_i, z_i)$, at time $t_i$, the location in frame i+1, $\bar{r}_{i+1}$ is calculated:

$$\bar{r}_{i+1} = \bar{r}_i + e, \text{rar}/v/ (\bar{r}_i, t_i) \Delta t$$

The precision of the resulting trajectory depends on the precision of the velocity estimates. Thus, while single pixel trajectories can be used, enhanced precision can be achieved as the size of the region is increased and the average within the region is used. This average is the average motion of the region, so the ROI should not be so large as to include structures with grossly different behavior. Although the volume is selectable and is limited at the low end to much less than 0.1 cc, regions with volumes of less than 0.25 cc are preferred for the study of myocardial motion.

Figure 1:
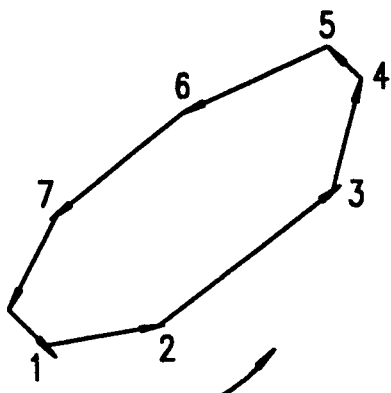
FIG. 1 is a plot illustrating actual cyclical motion of a region of interest.

In motion analysis with phase contrast cine MRI, the operator selects a region to be tracked by identifying its location in the first frame of th cine image set. The velocity in the region in the first frame is used to calculate its expected location in the second frame. The vector velocity in the second frame at the new location as portrayed in the cine set is used to calculate the position in the third frame, and so on. This tracking can be performed in three dimensions (3D) and can yield important information about cardiac or musculoskeletal motion noninvasively. Higher order integration methods can be used to improve the motion estimate. An 8 frame 2D example is shown in FIG. 1. The labeled arrowheads indicate the object position in each of 8 frames as well as the direction of motion. Limitations in this method arise from the additive velocity errors and noise, both of which accumulate during the integration of the trajectory.

One problem addressed in co-pending applications Ser. Nos. 7/865,437 and 07/921,804, supra, relates to additive errors in phase contrast cine MRI. While many eddy current effects are common to the measurements used to derive velocity information, the gradient changes used to encode velocity can cause differential eddy current effects, and these in turn produce unwanted phase shifts in the images. These unwanted phase shifts appear as additive velocity errors in the images. For example, static structures might appear to have a small non-zero velocity. Because of the repetitive manner in which the NMR sequences are implemented and the way the cine acquisition is performed, these additive errors can be assumed to be constant throughout the cycle. Also, because of the nature of the magnetic fields that induce the eddy currents, the unwanted phase shifts vary very slowly spatially across the images.

The additive velocity errors produce errors in the computed motion. The apparent motion between the first and second frame will be composed of the true motion plus a motion error proportional to the additive velocity error. Because the velocity error is constant as a function of time and varies slowly in space, the motion error will accumulate and grow as the trajectory is computed.

Figure 2:
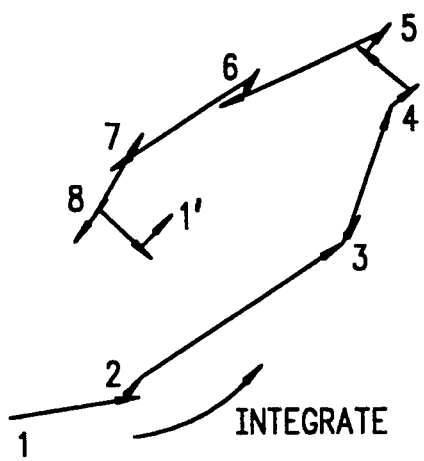
FIG. 2 is a plot illustrating calculated cyclical motion using convention phase contrast cine MRI in the presence of additive velocity errors.

This effect is shown in FIG. 2 for the example of FIG. 1. The error in each frame is shown as a dash line arrow and the errors accumulate to produce the discrepancy between the starting point (1) and the ending point (1') during a complete cycle.

The co-pending applications exploit the fact that the motion is known to be cyclical. Thus, at the end of the cycle the object must return to a position. This a-priori knowledge is used to estimate the velocity error, force the computed trajectory to "close" (return to the starting location), and thereby improves the stability and robustness of the method. Cyclical motion of a region can be calculated in a forward direction and a backward direction, and calculated positions at each frame in the two trajectories are weighted and combined. Iterative algorithms for defining position based on calculated velocity and estimated velocity vector are given therein.

As noted in Pelc, U.S. Pat. No. 5,195,525, supra., when combining deformation contributions from multiple time frames, it is important to maintain a consistent and rational coordinate system. This is done in the '525 patent by rotating the incremental strain tensor in each frame by the negative of the rotation up to that frame. Integration of the strain tensor is done on the rotated incremental strains. The present invention provides a simpler method for accomplishing the same task.

Figure 3:
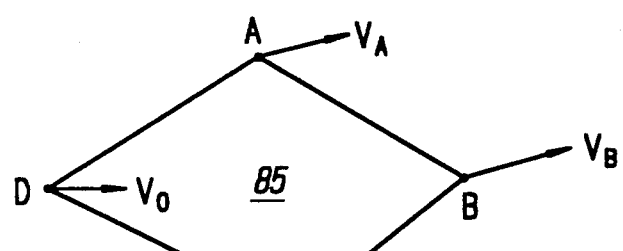
FIG. 3 is a plot illustrating tracking of deformable regions by phase contrast MRI in accordance with the invention.

Referring now to FIG. 3, suppose a two dimensional region of interest is defined by the polygon having a plurality of vertices A, B, C, D. In each frame, the average velocity and velocity gradients within the region of interest 85 are computed, for example, using a least square fit. It is known that this information is all that is needed to describe the motion of the region if its deformation is homogeneous. In the prior art, rotation and strain tensors are computed from the gradient tensor and these are then integrated with care taken to maintain a consistent coordinate system. In the method in accordance with the invention, the results of the fit are used to estimate the velocities at the vertices. These are then used to track the vertices exactly as in the algorithm that tracks rigid motion (i.e., no rotation or deformation). However, if the region has non-zero velocity gradients, the velocities at the vertices will not be the same, and the region, as defined by the vertices, will rotate and/or deform. Thus, integration of rotation and strain is done automatically by tracking the vertices separately.

Referring to FIG. 3, the motion and deformation of the region 85 is computed by using estimates of the velocities of the vertices, $V_A$, $V_B$, $V_C$, $V_D$. This can be done using the measured velocity at the pixels corresponding to the vertices, but this is not ideal in the presence of noise. The motion estimate is improved by using all the pixels within the region 85 along with some a priori knowledge of the expected variability of the velocities within the region. In rigid tracking of the region, only the average value within the region is used, which is fine from a noise standpoint, but cannot be used if rotation and/or deformation are present. In the '525 patent, the spatial gradients of velocity are used to infer rotation and deformation by integrating the rotation rate and strain rate. Difficulties in this method arise in the need to maintain a consistent coordinate system. However, in the present invention, this happens automatically. If it is assumed that the deformation within the region is homogeneous, then the velocities of all points within the region will at most vary linearly with position (analogous to using spatial derivatives in the '525 patent). Therefore, all pixels in the region are used to calculate a fit that includes linearly varying terms. For example, for the X velocity, the fit is:

$$V_x = V_{xo} + \alpha_x x + \beta_x y$$

Where $V_{xo}$ is the average, $\alpha_x$ is the x gradient of the x velocity and $\beta_x$ is the y gradient of the x velocity. This is done for all components of velocity and for all spatial directions (including a Z direction for a three-dimensional region of interest). The velocities at the vertices are then calculated from the fits, and from the velocities the motion and deformation of the region can be calculated.

As noted above, the advantage of using the fit process, and the results of the fit evaluated at the vertices rather than the measured velocity at the vertices, is reduced noise. All of the pixels within the region contribute to the estimate of the mean velocity and velocity gradients. As long as the deformation is homogeneous, there is no loss of generality in using this approach.

In fact, the invention can be extended to non-homogeneous deformation. Assume that a region of the heart is selected, including both endocardial and epicardial muscle. Some transmural difference in deformation is expected. As a result, a linear region extending radially across the heart can be deformed into a curved line. This type of deformation is not homogeneous, and cannot be depicted if only the mean velocity and the velocity gradients within the region are retained. To study this type of motion, a region having several vertices in the radial direction can be selected. The velocities within the region can be modeled as a polynomial of degree higher than one, e.g., second or third order. The results of the fit are then used to estimate the velocity at the vertices and the trajectories of the vertices computed. Then, for example, if there is non-linear variation of the circumferential velocity as a function of position in the radial direction, vertices along an originally straight line in the radial direction will be seen to deform into a curved line.

It is also possible to allow less degree of motion freedom. For example, the velocity fit within the region can be restricted to be consistent with translation and rotation but not with strain. This is done by forcing the velocity gradient tensor to be anti-symmetric. Thus, if it is known a priori that the region is translating and rotating, this information can be accommodated into the algorithm to improve the stability and precision of the result as compared to full motion freedom.

It is also possible to use regions other than polygons or polyhedra. For example, in 2D one can use an ellipse. Assuming uniform deformation an ellipse will deform into another ellipse. Points are selected along the elliptical boundary and tracked. The parameters of the deformed ellipse can be computed from the tracked points. Four points are sufficient to define the ellipse in 2D.

The key aspects of the invention are: (1) fit the velocities within the region to a model that is consistent with the expected motion, (2) estimate the velocity at points using the modeled fit, and (3) track the points.

Figure 4:
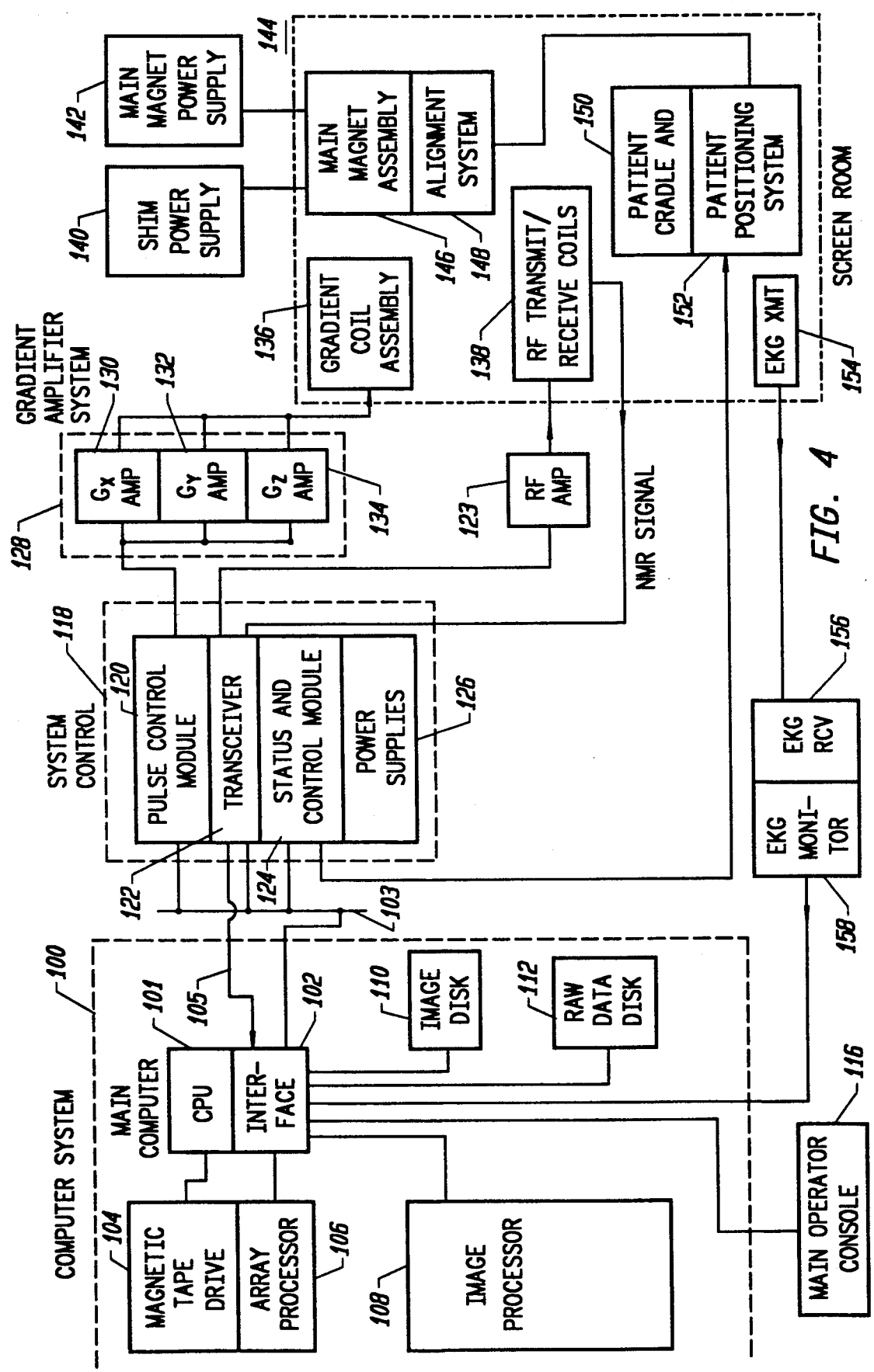
FIG. 4 is a block diagram of an NMR system in which the invention can be employed.

Referring to FIG. 4, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and cine display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape and to allow the operator to select which regions are to be analyzed.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spins in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Also within screen room 144 is EKG transmitter 154 which, through EKG leads (not shown), senses the electrocardiogram (EKG) of the patient (not shown). The sensed EKG signal is transmitted through to EKG receiver 156 to EKG monitor (158), both of which are outside the screen room. EKG monitor processes the EKG signal to derive an EKG trigger which is used by CPU 101 for the timing information necessary for cine MR imaging.

Computer 100 is programmed to execute the motion analysis algorithms described above, and in particular the method of the present invention.

Figure 5:
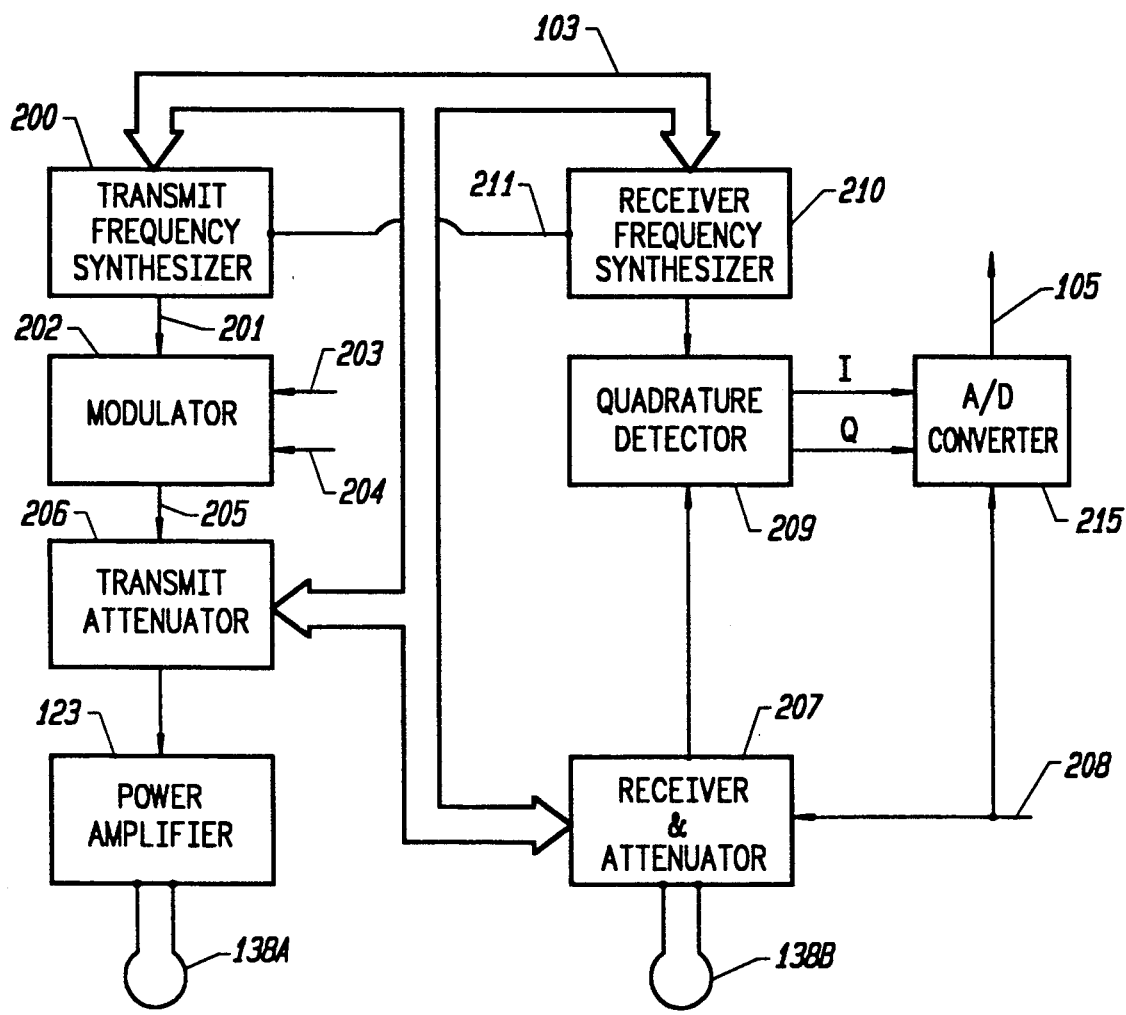
FIG. 5 is an electrical block diagram of a transceiver which forms part of the NMR system of FIG. 4.

Referring particularly to FIGS. 4 and 5 the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

The NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters to a pair of analog to digital converters indicated collectively at 215. The quadrature detector 209 also receives an RF reference signal from a second frequency synthesizer 210 and this is employed by the quadrature detector 209 to sense the amplitude of that component of the NMR signal which is in phase with the RF reference (I signal) and the amplitude of that component of the NMR signal which is in quadrature therewith (Q signal).

The I and Q components of the received NMR signal are continuously sampled and digitized by the A/D converter 215 at a sample rate of 64 kHz throughout the acquisition period. A set of 256 digital numbers are simultaneously acquired for each I and Q component of the NMR signal, and these digital numbers are conveyed to the main computer 101 through the serial link 105. Each pair of numbers is thought of as a complex value equal to I+iQ. The NMR system of FIG. 4 performs a series of pulse sequences to collect sufficient NMR data to reconstruct the desired images as described above.

The described invention provides an improved method of tracking deformable regions using phase contrast MRI. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of calculating motion of a region within an object using magnetic resonance imaging measurements comprising the steps of:
   a) positioning said object in a magnetic field,
   b) obtaining magnetic resonance signals representative of at least one velocity component of said region in a plurality of time frames,
   c) defining said region by a plurality of vertices,
   d) estimating velocity at said plurality of vertices using a model of expected motion, and
   e) tracking motion of said region based on movement of said plurality of vertices in said plurality of time frames.

2. The method as defined by claim 1 wherein said region is two-dimensional in an x axis and a Y axis and said at least one velocity component includes Vx given by the relationship $$V_x = V_{xo} + \alpha_x x + \beta_x y$$

where
   $V_{xo}$ is average x axis velocity
   $\alpha_x$ is x gradient of x velocity
   $\beta_x$ is y gradient of x velocity.

3. The method as defined by claim 2 and further including a velocity component $V_y$ given by the relationship $$V_y = V_{yo} + \alpha_y y + \beta_y x$$

where
   $V_{yo}$ is average y axis velocity
   $\alpha_y$ is y gradient of y velocity
   $\beta_y$ is x gradient of y velocity.

4. The method as defined by claim 3 wherein said motion is restricted to translation and rotation and velocity gradients are anti-symmetric.

5. The method as defined by claim 2 wherein said average velocity and velocity gradients within said region are computed using a least square fit.

6. The method as defined by claim 1 wherein said region experiences homogeneous deformation.

7. The method as defined by claim 1 wherein said region comprises a polygon.

8. The method as defined by claim 1 wherein said region is defined by an ellipse.

9. The method as defined by claim 1 wherein said region is a three-dimensional polyhedron and includes three velocity components for each vertex.

10. The method as defined by claim 1 wherein said region is deformable and deformation is non-homogeneous, said at least one velocity component is defined by a polynomial of at least second order.

11. The method as defined by claim 10 wherein at least some of said vertices lie in a radial direction.

12. Magnetic resonance imaging apparatus for tracking motion of a region within an object comprising
   means for establishing a magnetic field through said region,
   means for obtaining magnetic resonance signals representative of at least one velocity component of said region in a plurality of time frames,
   means for defining said region by a plurality of vertices and estimating velocity at said vertices using a model of expected motion, and
   means for tracking motion of said region based on movement of said plurality of vertices in said plurality of time frames.

* * * * *

UNITED STATES PATENT AND TRADEMARK OFFICE
CERTIFICATE OF CORRECTION

PATENT NO.  : 5,318,026
DATED       : June 7, 1994
INVENTOR(S) : NORBERT J. PELC It is certified that error appears in the above-identified patent and that said Letters Patent is hereby corrected as shown below:

On page 1, after the title, insert the following paragraph after line 5:

--This invention was made with Government support under contract No. 1R01HL46347 awarded by the National Institutes of Health. The Government has certain rights in this invention.--

Signed and Sealed this

Thirteenth Day of December, 1994

Attest:

BRUCE LEHMAN

Attesting Officer    Commissioner of Patents and Trademarks